(12) United States Patent  
Miura

(10) Patent No.: US 8,669,701 B2
(45) Date of Patent: Mar. 11, 2014

(54) ORGANIC EL ELEMENT ARRAY

(75) Inventor: Seishi Miura, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/218,003

(22) Filed: Aug. 25, 2011

(65) Prior Publication Data

US 2012/0009333 A1 Jan. 12, 2012

Related U.S. Application Data

(63) Continuation of application No. 11/049,963, filed on Feb. 4, 2005, now Pat. No. 8,026,666.

(30) Foreign Application Priority Data

Feb. 6, 2004 (JP) .................................. 2004-030829

(51) Int. Cl.
*H01L 51/52* (2006.01)

(52) U.S. Cl.
USPC ............................ 313/506; 313/504; 313/505

(58) Field of Classification Search
USPC ................... 313/498–512; 315/169.1, 169.3; 428/690–691, 917; 438/26–29, 34, 82; 257/40, 72, 98–100, 642–643, 759; 427/66, 532–535, 53
See application file for complete search history.

(56) References Cited

U.S. PATENT DOCUMENTS

| 5,616,427 | A | 4/1997 | Tada | |
|---|---|---|---|---|
| 6,303,255 | B1 * | 10/2001 | Sakaguchi et al. | 430/97 |
| 6,366,016 | B1 | 4/2002 | Sakaguchi et al. | |
| 6,734,623 | B1 | 5/2004 | Aziz et al. | |
| 6,737,127 | B2 | 5/2004 | Tsuboyama et al. | |
| 7,553,560 | B2 * | 6/2009 | Lamansky et al. | 428/690 |
| 7,666,691 | B2 | 2/2010 | Park | |
| 8,026,666 | B2 * | 9/2011 | Miura | 313/506 |
| 2001/0030508 | A1 * | 10/2001 | Utsugi et al. | 313/505 |
| 2002/0014837 | A1 | 2/2002 | Kim et al. | |
| 2003/0020181 | A1 * | 1/2003 | Yamada | 257/787 |
| 2003/0034722 | A1 | 2/2003 | Tsuboyama et al. | |
| 2003/0122140 | A1 | 7/2003 | Yamazaki et al. | |
| 2003/0141809 | A1 * | 7/2003 | Furugori et al. | 313/504 |
| 2003/0235712 | A1 * | 12/2003 | Takiguchi et al. | 428/690 |
| 2004/0076853 | A1 | 4/2004 | Jarikov | |
| 2004/0214038 | A1 | 10/2004 | Kwong et al. | |
| 2004/0247934 | A1 * | 12/2004 | Takeuchi et al. | 428/690 |
| 2005/0048311 | A1 | 3/2005 | Hatwar et al. | |
| 2005/0082532 | A1 | 4/2005 | Murakami et al. | |
| 2005/0089714 | A1 | 4/2005 | Hatwar et al. | |
| 2005/0123797 | A1 | 6/2005 | Kondakova et al. | |
| 2005/0264866 | A1 * | 12/2005 | Ohtaka et al. | 359/290 |
| 2013/0164875 | A1 * | 6/2013 | Lamansky et al. | 438/47 |

FOREIGN PATENT DOCUMENTS

| JP | 5-258859 | 10/1993 |
|---|---|---|
| JP | 11-214157 | 8/1999 |
| JP | 2002-343572 | 11/2002 |
| JP | 2005-150078 | 9/2005 |

* cited by examiner

*Primary Examiner* — Anh Mai
*Assistant Examiner* — Fatima Farokhrooz
(74) *Attorney, Agent, or Firm* — Fitzpatrick, Cella, Harper & Scinto

(57) ABSTRACT

An organic EL element array is provided which can more easily be produced with a high aperture ratio and a high definition and in which light-emitting layers of organic EL elements adjacent to each other in an interpixel region mutually overlap in the interpixel region.

10 Claims, 7 Drawing Sheets

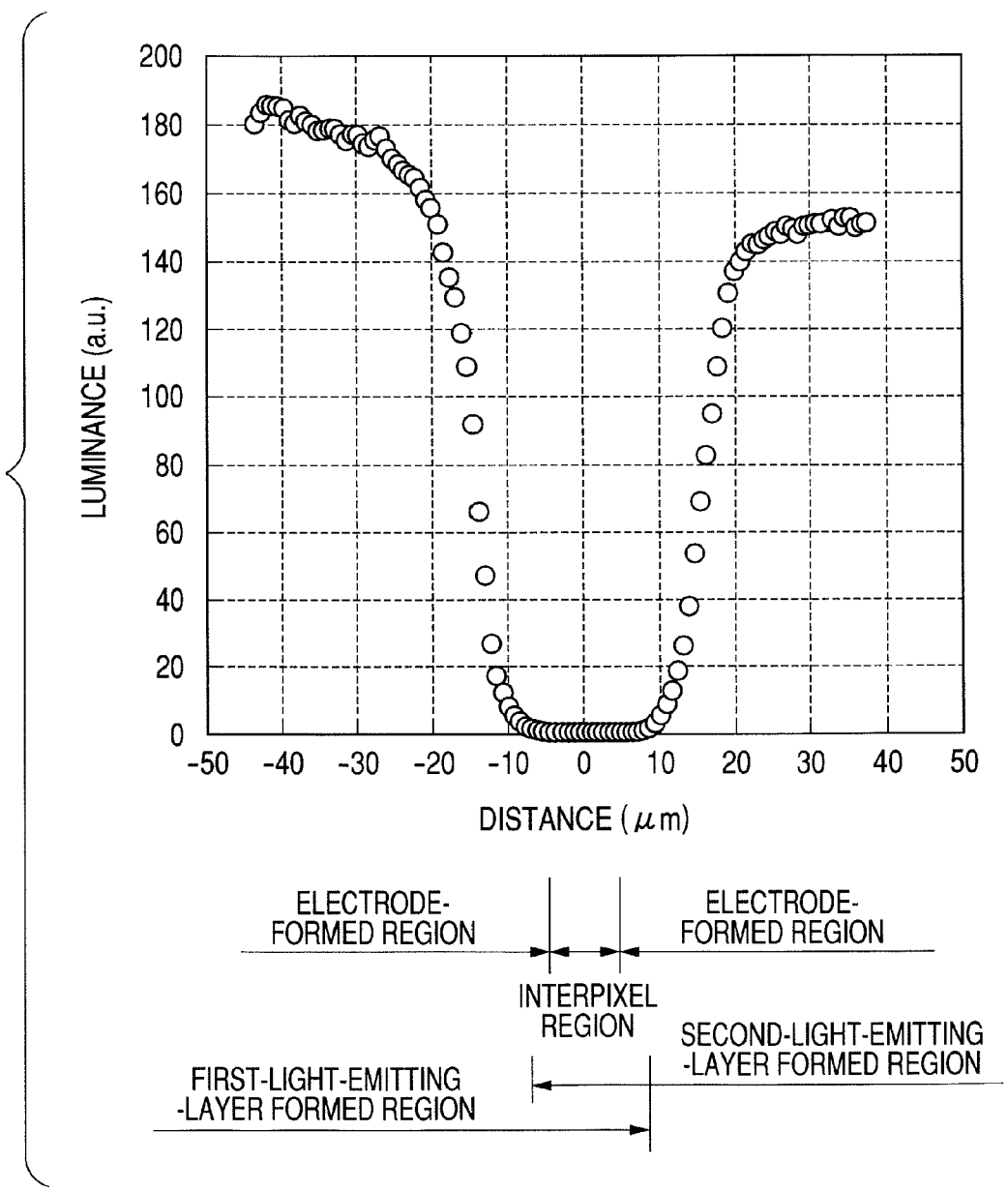

ORGANIC EL ELEMENT ARRAY

The present application is a continuation of U.S. patent application Ser. No. 11/049,963 filed Feb. 4, 2005 now U.S. Pat. No. 8,026,666, the entire disclosure of which is incorporated by reference herein.

BACKGROUND OF THE INVENTION

1. Field of the Invention

The present invention relates to an organic EL element array used for a display, an exposure light source for an electrophotographic photosensitive member, and a lighting equipment.

2. Related Background Art

A self-emitting device corresponding to a flat panel is recently noticed. The self-emitting device includes a plasma display element, a field emission element, an electroluminescent (EL) device, and the like.

Of these devices, research and development have dynamically been progressed particularly for an organic EL element. An area color display of a single green color to which colors such as blue and red may be added has been manufactured and development to a full color display is being activated at present.

As a method of manufacturing a conventional organic EL panel adopting an independent three-color emission system for respectively emitting lights of different wavelengths independently of one another, Japanese Patent Application Laid-Open No. H05-258859 discloses a method of forming a transparent electrode pattern on a glass substrate using ITO and the like, then setting a shadow mask made of an insulating material on the substrate, and forming individual organic layers.

Further, Japanese Patent Application Laid-Open No. H11-214157 discloses a technique for separate color application of RGB in which adjacent pixels are formed such that a gap therebetween is filled with a light-emitting layer or electron-transporting layer or they overlap each other.

As shown in FIG. 1, these are techniques for evaporating an organic material in a vacuum chamber in which a mask is inserted between a substrate and an evaporation source to form an organic material layer at a desired location. FIG. 1 is a schematic view for explaining a conventional technique for evaporating an organic EL element through a mask. In the figure, reference numeral 1 denotes a substrate, reference numeral 2 denotes an evaporation mask, reference numeral 3 denotes an evaporated film, and reference numeral 4 denotes an organic material.

When carrying out separate color application of RGB by means of the mask evaporation, there has been a problem that an effective emission area (aperture ratio) becomes smaller as the definition becomes higher.

For example, when preparing a full color panel of 200 ppi, the pixel pitch thereof is approximately 127 μm and moreover, in order to display RGB in one pixel, each pixel region will have a width that is ⅓ (approximately 42 μm in the case of stripe) of the pixel pitch. In order to form organic EL elements of the respective colors in these pixel regions without causing color mixing, a width of a region capable of actually emitting light will become approximately 20 μm when assuming an alignment margin of ±10 μm.

Moreover, when the above-mentioned highly accurate, separate color application is to be attained by use of a mask, there has been a problem that because a region of a uniform film thickness will become small due to the thickness of the mask or the clearance between the mask and a substrate, an effective emission region becomes smaller.

In particular, with an organic EL element having a top emission structure for performing active matrix driving such as shown in FIG. 7, although a driving circuit can be formed under a pixel electrode and it is therefore theoretically possible to realize an aperture ratio of 90% or more, such a high performance cannot sufficiently be exploited due to the above-mentioned problems. Here, FIG. 7 is a sectional view of a conventional organic EL element having a top emission structure. In the figure, reference numeral 27 denotes a transparent electrode, 28 denotes an organic light-emitting layer, 29 denotes a reflective electrode, 30 denotes a source region, 31 denotes a drain region, 32 denotes a gate electrode, 33 denotes a drain electrode, and 34 denotes a glass substrate.

SUMMARY OF THE INVENTION

The present invention has been accomplished to solve the above-described problems, and it is an object of the present invention to provide a high-aperture-ratio, high-definition organic EL element array with a simpler configuration comprising a plurality of organic EL elements having two or more emission colors.

Therefore, the present invention provides an organic EL element array comprising a plurality of organic EL elements disposed on a base member, each said organic EL element comprising a lower electrode, a first carrier-transporting layer, a light-emitting layer disposed on said first carrier-transporting layer, a second carrier-transporting layer disposed on said light-emitting layer, and an upper electrode to form one pixel, wherein said first carrier-transporting layer of a first organic EL element of said plurality of organic EL elements is formed in common with said first carrier-transporting layer of a second organic EL element disposed adjacent to said first organic EL element through an interpixel region, said second carrier-transporting layer of said first organic EL element is formed in common with said second carrier-transporting layer of said second organic EL element through said interpixel region, and said light-emitting layer of said first organic EL element and said light-emitting layer of said second organic EL element have carrier-transporting properties different in kind from each other and mutually overlap in said interpixel region.

According to the present invention, by stacking light-emitting layers having transporting properties of different types of carriers at their adjoining portion, it is possible to more easily provide a high-aperture-ratio and high-definition organic EL element array.

BRIEF DESCRIPTION OF THE DRAWINGS

FIG. 9 is a graphical representation of a luminance distribution of pixels showing the effect of Example 1.

DESCRIPTION OF THE PREFERRED EMBODIMENTS

The present invention is different from the invention disclosed in Japanese Patent Application Laid-Open No. H11-214157 above in that light-emitting layers of adjoining light-emitting elements have different kinds of carrier transporting properties (that is, one light-emitting layer has an electron transporting property and the other light-emitting layer has a hole transporting property). Therefore, even if an overlapped portion of adjacent light-emitting layers extends to a pixel region, colors are not mixed. Therefore, there is an advantage that an interpixel region can be made small and an alignment margin can be made large when forming light-emitting layers as compared to the case of Japanese Patent Application Laid-Open No. H11-214157.

Moreover, it is preferable that an organic EL element array of the present invention has a configuration in which light-emitting layers of adjoining light-emitting elements having an inclination in an interpixel region overlap each other in the interpixel region and the carrier (i.e., hole or electron) transporting property of a light-emitting layer closer to one electrode in the interpixel region is different in kind of carrier from the carrier-transporting property of the other light-emitting layer located distant from the one electrode. Incidentally, it is needless to say that electrodes disposed on the same side of light-emitting layers are electrodes for supplying the same type carrier to the light-emitting layers (that is, in the case of an organic EL element array having a top emission structure to be described later, reflective electrodes of organic EL elements are disposed at the same side of light-emitting layers).

Hereafter, a specific embodiment of a multicolor light-emitting element array having a plurality of multicolor light-emitting elements that is an example of an organic EL element array of the present invention is described below by referring to FIG. 2. However, the present invention is not limited to this configuration.

Figure 1:
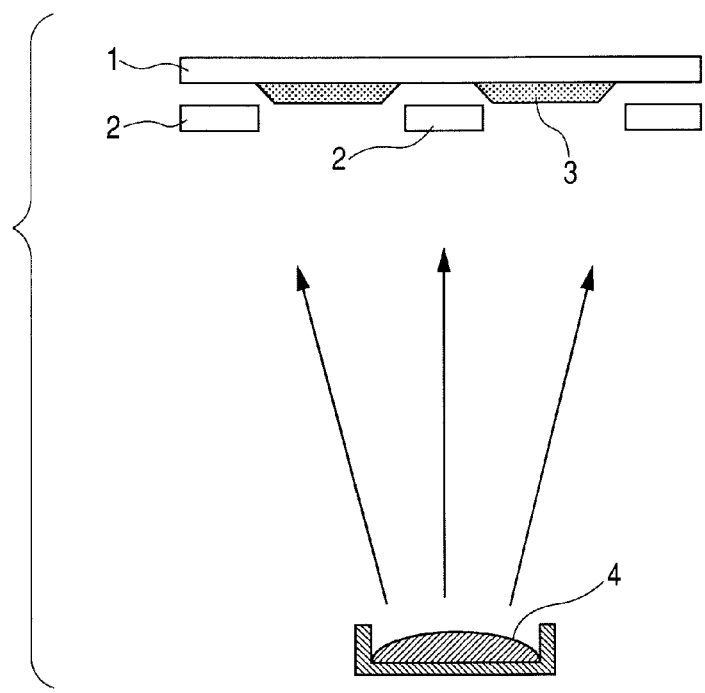
FIG. 1 is a schematic view for explaining a conventional technique for vacuum-evaporating an organic EL element through a mask.
Figure 2:
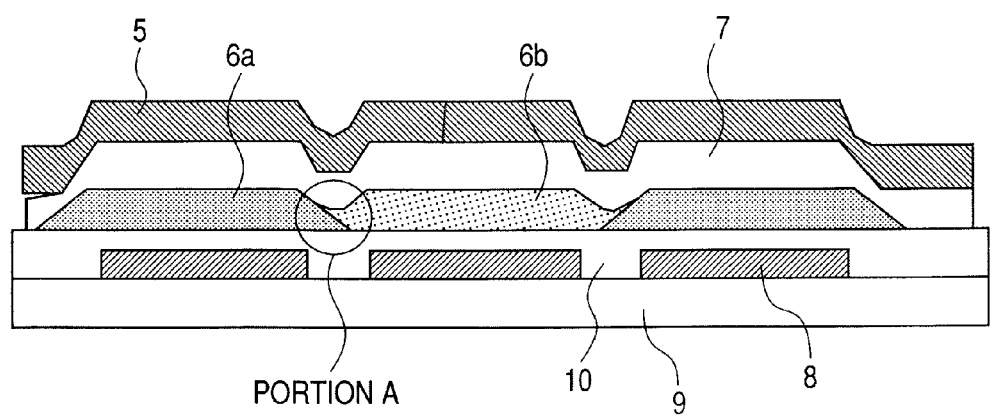
FIG. 2 is a schematic sectional view showing a configuration of an embodiment of a multicolor light-emitting element of the present invention.

The multicolor light-emitting element shown in FIG. 2 is illustrated as a configuration in which three elements are set on a substrate. The portion between elements is referred to as an interpixel region. The term "pixel" as employed herein is intended to mean one light-emitting element as a unit comprising a pair of electrodes and an organic layer sandwiched by the electrodes and to encompass a so-called single pixel and one subpixel.

In FIG. 2, reference numeral 5 denotes a cathode, 6a and 6b denote light-emitting layers, 7 denotes a second carrier-transporting layer, 8 denotes an anode, 9 denotes a substrate, and 10 denotes a first carrier-transporting layer.

A transparent electrode (first electrode) 8 serving as an anode which is a lower electrode is formed on a transparent substrate (generically referred to as "base member") 9 which is an example of a base member, and a first carrier-transporting layer 10, a light-emitting layer 6a, a light-emitting layer 6b, and a second carrier-transporting layer 7 are formed thereon as organic compound layers and a reflective electrode (second electrode) 5 serving as a cathode which is an upper electrode is further formed thereon. In FIG. 2, the light-emitting layers are separately coated as 6a and 6b and have emission spectrums different from each other. Moreover, the light-emitting layers 6a and 6b have carrier-transporting properties different in kind from each other. The organic layers including the light-emitting layers are formed by evaporation and the like and particularly, the light-emitting layers are formed at desired locations by using a mask.

In the following, for convenience of the description, a light-emitting layer of one of two adjacent light-emitting elements is referred to as "first light-emitting layer" and a light-emitting layer of the other of the two adjacent light-emitting elements is referred to as "second light-emitting layer".

The term "different kinds of carrier-transporting properties" as employed herein is intended to mean that when the electron transporting property of a light-emitting layer of one organic EL element is high, the hole transporting property of a light-emitting layer of the other organic EL element is high. That is, it can also be said that the carrier-transporting properties of light-emitting layers of organic EL elements are in a relation of different polarities (in a sense such that a hole is assumed as "+" and an electron is assumed as "−").

At this time, by adjusting the size of an opening portion of a mask, a region in which light-emitting layers overlap each other is formed by adjacent pixels as shown by portion A (interpixel region) in FIG. 2.

Incidentally, although in the attached drawings multicolor light-emitting elements are shown only for portions of two organic EL elements having different emission spectrums, the number of organic EL elements contained in the multicolor light-emitting elements is not limited thereto.

As a base member used to provide on a surface thereof a plurality of organic electroluminescent elements having organic compound layers including a light-emitting layer between a first electrode and a second electrode, in the case of taking out a light on the base member side, transparency is required as described above and it is preferable to use a transparent substrate. Examples of preferably used substrates include various types of glass substrates, a glass substrate on which a driving circuit such as a TFT is formed of poly-Si and a silicon wafer on which a driving circuit is formed. On the other hand, in the case of taking out a light on a side opposite to the base member side, it is not always necessary that a base member is transparent.

One of the first electrode and the second electrode serves as an anode, while the other serves as a cathode. It is preferable that either of the materials of these electrodes is transparent. It is preferable that a material having a high work function is used as an anode and a material having a low work function is used as a cathode. Specifically, as a metallic material of the cathode, there are preferably used metals with a low work function such as aluminum, an aluminum-lithium alloy, or a magnesium-silver alloy. Moreover, for the anode, a transparent conductive material having a high work function such as indium tin oxide (ITO) is preferably used. Incidentally, when a transparent electrode is to be used as the cathode, there is a method of providing a layer of the metallic material having such a low work function as to be available as the cathode in contact with the organic compound layer in a film thickness of 1 to 10 nm and then forming a layer of a transparent conductive material such as ITO at the outside of the metallic layer.

The organic layers such as a first carrier-transporting layer, first and second light-emitting layers and a second carrier-transporting layer constituting organic compound layers are formed by evaporation or the like. One of the first and the second carrier-transporting layers is made of a material capable of preferentially transporting holes (having a high electron-transporting property), while the other is made of a material capable of preferentially transporting electrons (having a high electron-transporting property). These materials may suitably be selected in accordance with the polarities of the first and the second electrodes to be used.

Incidentally, as the material of the light-emitting layer, there may be used a single material capable of providing a desired light emission or a material prepared by doping a host material with a guest material, and the doping method includes a method in which the host material and the guest material are vacuum-evaporated at the same time while adjusting the evaporation rates of the respective materials to provide a light-emitting layer having a desired doping concentration. At this time, it is possible to obtain a desired light emission from each organic EL element by suitably selecting the material of the light-emitting layer or the combination of the host/guest materials constituting the light-emitting layer depending on the emission color.

In the present invention, when the carrier-transporting properties of the first carrier-transporting layer and the first light-emitting layer are different in kind from each other, light emission is hardly observed in the region where the first light-emitting layer and the second light-emitting layer are stacked. Therefore, even if the alignment of a mask to a substrate is offset or a mask is lifted when forming a light-emitting layer and the formed light-emitting layer extends up to a pixel electrode adjacent to a light-emitting-layer forming region, it is possible to avoid color mixing because the region emits no light.

It is considered that this effect may be produced by the following mechanism.

An organic EL element is a carrier-injection-type self-emitting device that utilizes light emission produced when electrons and hole reaching a light-emitting layer recombine. Therefore, when layers having carrier-transporting properties different in kind from each other are stacked alternately, the number of those carriers which can recombine in the light-emitting layer become extremely small and a stacked portion will emit no light. Even if carriers can be injected, the amount thereof is very small compared to that of a normal light-emitting region. Therefore, it is estimated that the region emits substantially no light.

Figure 3:
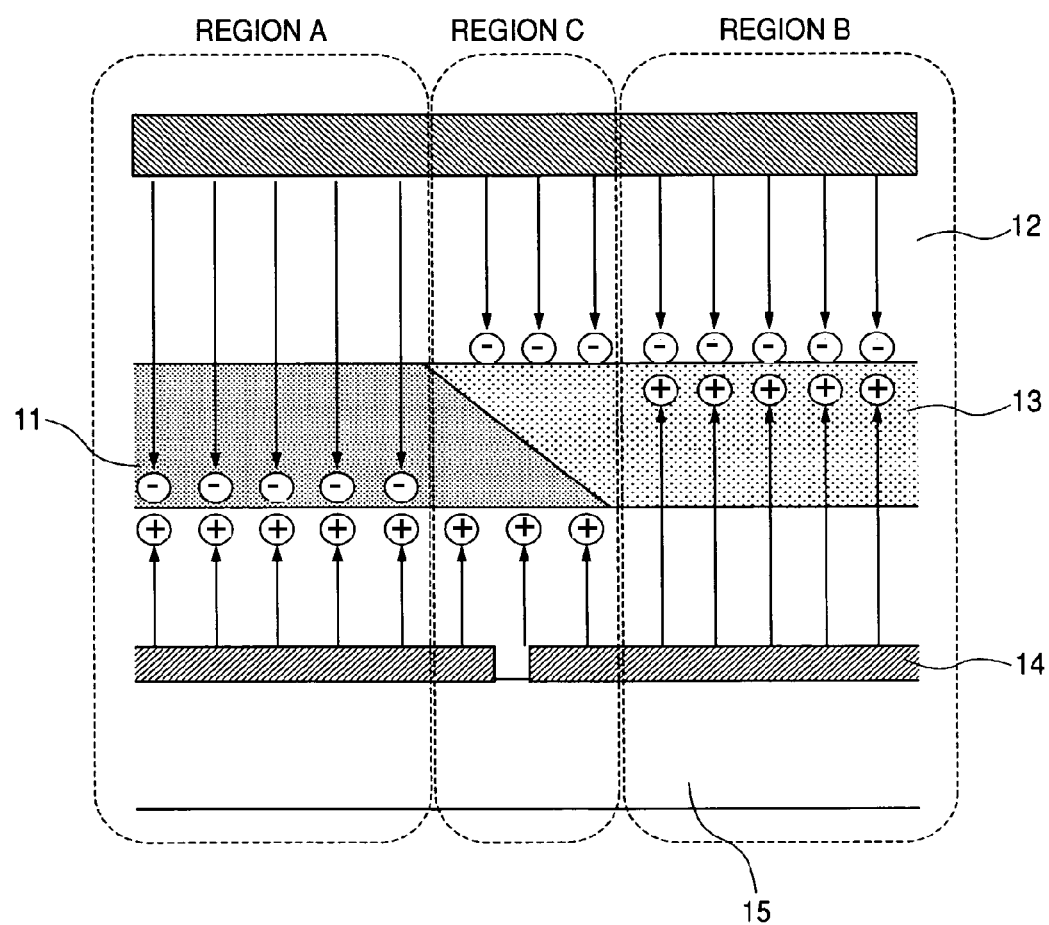
FIG. 3 is a schematic view for explaining a relation between carrier-transporting characteristics and a light-emitting region of a light-emitting layer.

FIG. 3 shows a schematic view when a first carrier-transporting layer has a hole-transporting property, a first light-emitting layer has an electron-transporting property, a second light-emitting layer has a hole-transporting property, and a second carrier-transporting layer has an electron-transporting property. In FIG. 3, electrons and holes recombine in the first and the second light-emitting layers in a region A and a region B, respectively. In a region C, no light is emitted because neither electrons nor holes are injected into the light-emitting layers. The region C corresponds to the above-mentioned portion A (interpixel region). In FIG. 3 reference numeral 11 denotes the first light-emitting layer, 12 denotes the electron-transporting layer, 13 denotes the second light-emitting layer, 14 denotes a transparent electrode and 15 denotes a transparent substrate (generically referred to as "base member").

When a non-emitting region is formed on a pixel, there is a fear of reduction of the total luminance. However, by driving an organic EL element in a current control fashion (a desired gradation level is displayed by adjusting a current value), the reduction of an emission area is self-compensated, thereby posing no problem to an actual image quality. That is, when assuming the luminance of a given pixel as L (cd/m$^2$), the emission area of the pixel as S (m$^2$), the value of current flowing as I1 (A) and the current efficiency (cd/A) of an organic EL element as $\alpha$, the total luminous flux $\phi$(lm) discharged from the pixel is expressed by $$\phi = \pi \times L \times S = \pi \times \alpha \times \frac{I1}{S} \times S = \pi \times \alpha \times I1$$

and it is found that the total emission quantity of the pixel is not related to the emission area but depends only on the current value.

Figure 4:
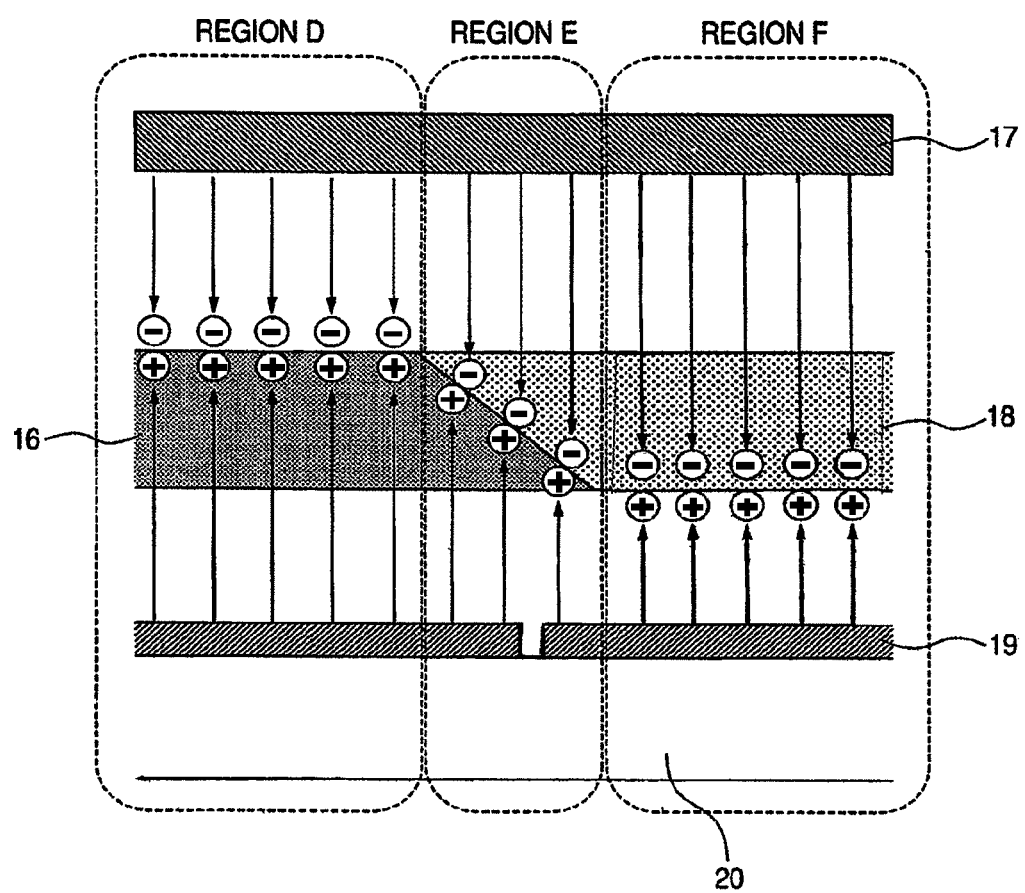
FIG. 4 is a schematic view for explaining a relation between carrier-transporting characteristics and a light-emitting region of a light-emitting layer.

Moreover, in the present invention, when the carrier-transporting properties of a first carrier-transporting layer and a first light-emitting layer are the same kind, electrons and holes recombine in the vicinity of a stacking interface between the first light-emitting layer and a second light-emitting layer and the energy of generated excitons transfer to pigment molecules having a lower energy to emit light. FIG. 4 shows a schematic view when the first carrier-transporting layer has a hole-transporting property, the first light-emitting layer has a hole-transporting property, the second light-emitting layer has an electron-transporting property, and a second carrier-transporting layer has an electron-transporting property. In the figure, reference numeral 16 denotes the first light-emitting layer, 17 denotes a cathode, 18 denotes the second light-emitting layer, 19 denotes an anode and 20 denotes a transparent substrate (generically referred to as "base member").

In region D in FIG. 4, electrons and holes are recombine at the interface between the second carrier-transporting layer and the first light-emitting layer, so that the first light-emitting layer emits light. In region F, electrons and holes recombine at the interface between the first carrier-transporting layer and the second light-emitting layer, so that the second light-emitting layer emits light. In region E, although the interface between the first light-emitting layer and the second light-emitting layer becomes a recombination region, either one of the light-emitting layers whose emission spectrum is present at a longer wavelength side emits light due to the energy transfer. Here, the region E corresponds to the above-mentioned portion A (interpixel region).

At this time, by previously forming widely the formation region of a light-emitting layer (first light-emitting layer) that emits light on a shorter wavelength side and forming narrowly the formation region of a light-emitting layer that emits light on a longer wavelength side, the margin to alignment can be widened to provide a larger aperture ratio.

Description will be continued with reference to FIG. 5.

Figure 5A:
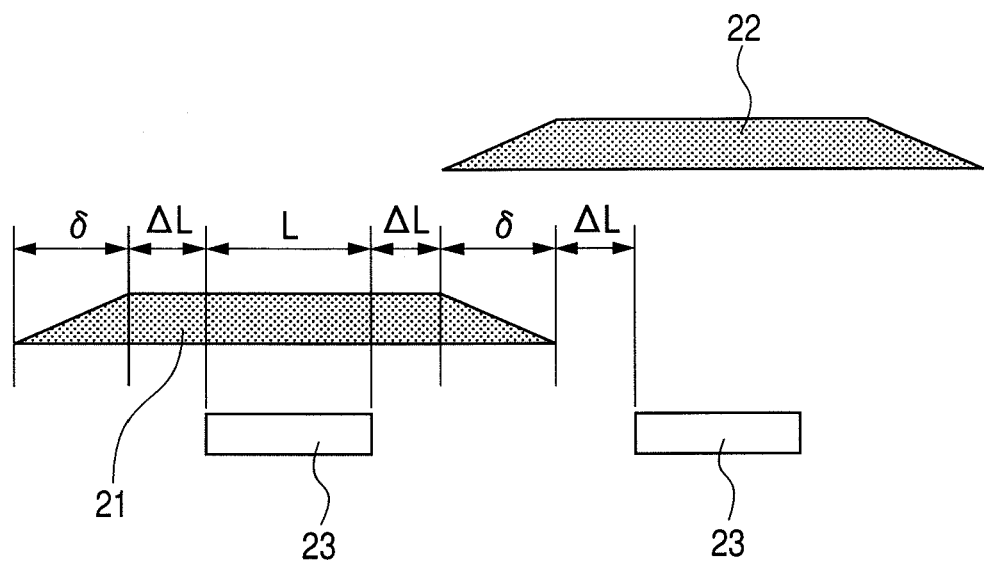
FIGS. 5A and 5B are views for explaining a positional relation between a pixel-electrode and a region for forming a light-emitting layer.
Figure 5B:
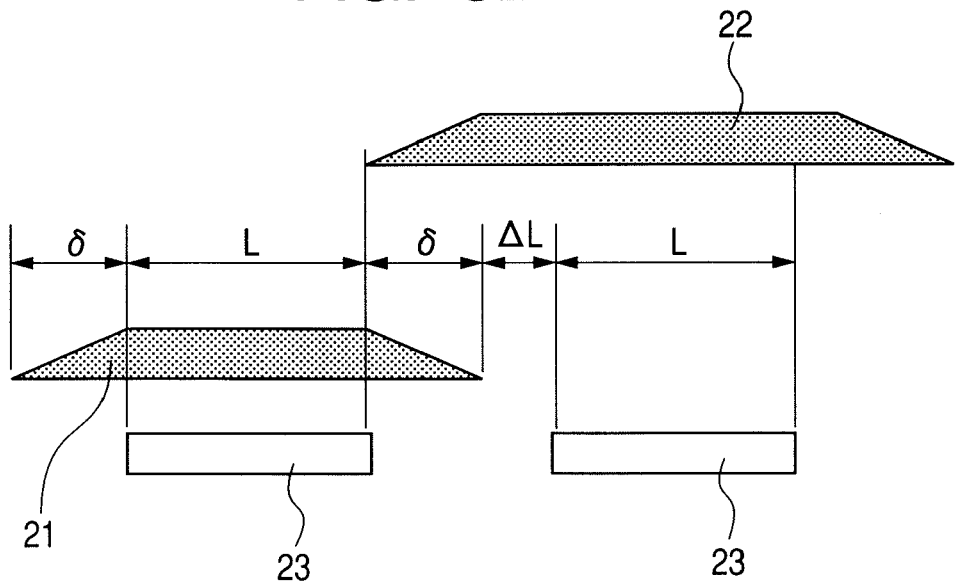

FIGS. 5A and 5B are schematic views for explaining the positional relation between regions for forming pixel electrodes and light-emitting layers. In the figures, reference numeral 21 denotes a first light-emitting layer, 22 denotes a second light-emitting layer and 23 denotes a pixel electrode respectively.

For example, when assuming that light-emitting layers whose cross sections are trapezoidal can be formed through mask evaporation, and that the alignment accuracy between the mask and a substrate is $\pm\Delta L$ and the width of the film-thickness varied portion at the periphery is $\delta$, a width of $2\Delta L+\delta$ has hitherto been required for the region between pixel electrodes (FIG. 5A). Incidentally, the trapezoidal light-emitting layers are each disposed such that the longer side is closer to the substrate than the shorter side is.

On the other hand, according to the present invention, the interval between pixel electrodes becomes $\Delta L+\delta$ because the overlapping of the film-thickness varied portion is allowed (FIG. 5B).

FIG. 5 illustrates only the positional relation between the electrodes and the first and the second light-emitting layers for simplification.

In general, although the width of a film-thickness varied portion at a periphery formed by mask evaporation depends on the thickness of a mask, clearance between a substrate and the mask or an edge shape of the mask, a width of about 10 μm to 30 μm is produced. For example, it is assumed for a pixel of 40 μm in pitch that the alignment accuracy is ±10 μm and the width of the film-thickness varied portion of the pixel is 10 μm, only an effective emission region of 10 μm in width can hitherto be obtained. However, according to the present invention, an effective emission region of 20 μm in width, which is twice that width, can be obtained.

The organic EL element array of the present invention can also be used as an organic EL element array with the so-called top emission structure in which light is taken out on a side opposite to a substrate side.

The organic EL element array of the present invention can be applied to a display. For example, the array can be applied to a display screen or finder screen of a digital camera, a display screen of a mobile phone, a printer operation screen of a copying machine or the like, a display screen of a television or a personal computer, vehicle display panel, and so on. Moreover, the array can be applied to an exposure light source for forming a latent image on a photosensitive member of an electrophotographic image forming apparatus, a light source for interior lighting, and the like.

EXAMPLES

The following examples are given for the purpose of illustration and not by way of limitation.

Example 1

A multicolor light-emitting element of the structure shown in FIG. 2 was prepared. In this example, only light-emitting layers having emission spectrums of two colors of green and red were formed as the light-emitting layers 6a and 6b.

A glass substrate (Corning 1737 (trade name) manufactured by Corning Inc.) (transparent substrate 9) having an ITO layer of 100 nm in thickness formed thereon was prepared and patterned by means of photolithography to form the anode (transparent electrode 8) thereby forming an ITO substrate.

An organic compound layer and an electrode layer were continuously formed on the ITO substrate in a vacuum chamber of $10^{-4}$ Pa by means of vacuum evaporation using resistive heating to obtain an element A. A mask used for evaporation had a thickness of about 20 μm.

The materials used and film thicknesses for the respective layers are shown in Table 1 below. In this example, the hole-transporting layer corresponds to the first electron-transporting layer 10 and the electron-transporting layer corresponds to the second carrier-transporting layer 7.

Further, a mixture layer using $Alq_3$ as a host and Coumarin 6 as a guest was used as the first light-emitting layer and a mixture layer using CBP as a host and $Ir(piq)_3$ as a guest was used as the second light-emitting layer.

It is known that $Alq_3$ has a high electron-transporting property and CBP has a high hole-transporting property.

TABLE 1

| Functional Layers | | Material | Film Thickness |
|---|---|---|---|
| Hole-transporting layer | | FL03 | 40 nm |
| First light-emitting layer (Green) | Host | $Alq_3$ | 30 nm |
| | Guest | Coumarin 6 1% | |
| Second light-emitting layer (Red) | Host | CBP | 30 nm |
| | Guest | $Ir(piq)_3$ 9% | |
| Electron-transporting layer | | Bathophenantroline | 50 nm |
| Electron injection layer | | AlLi | 10 nm |
| Cathode | | Al | 150 nm |

The above materials were deposited through coevaporation by successively using masks each having an opening at a portion at which the light-emitting layer corresponding to the given color was to be formed. The doping concentration was adjusted to a predetermined value by controlling the deposition rates of the respective materials during the coevaporation.

Incidentally, the chemical formulae of the materials used in this example are as follows.

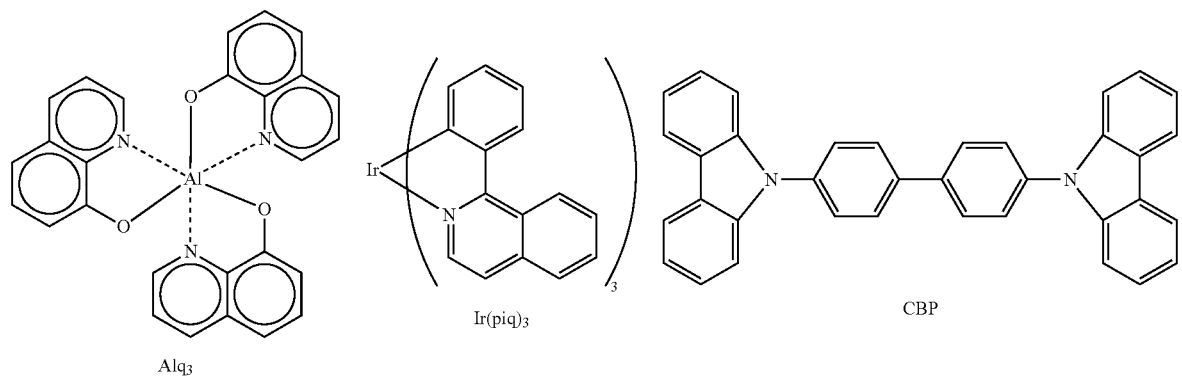

Alq₃         Ir(piq)₃         CBP

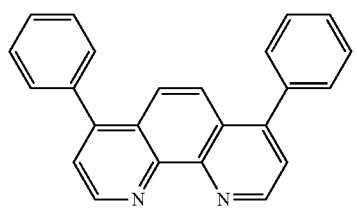

Bathophenantroline

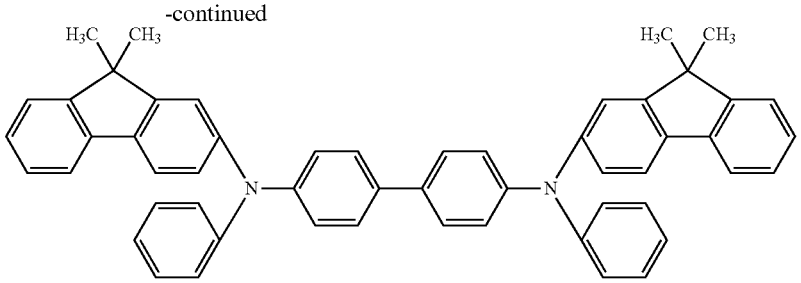

FL03

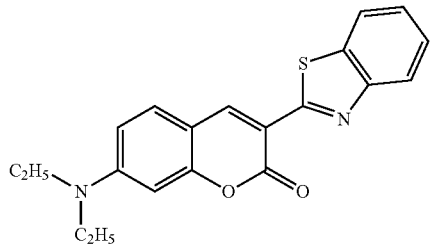

Coumarine 6

The width δ of a peripheral region of the film as evaporated in a thickness of 30 nm through a mask was approximately 15 μm.

Figure 8:
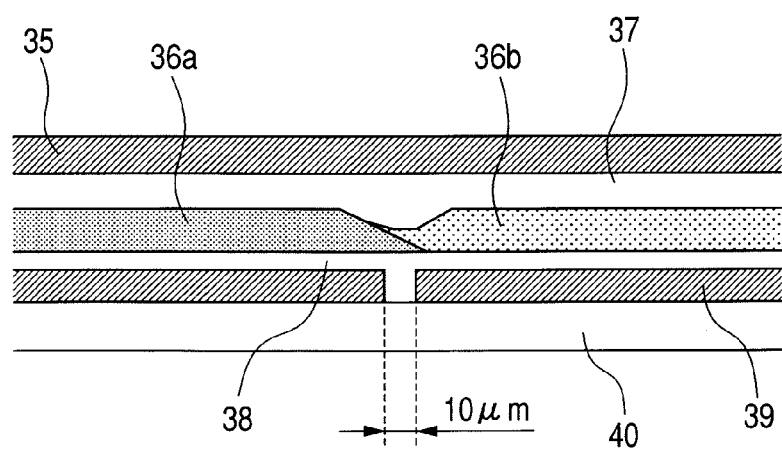
FIG. 8 is a schematic sectional view of a multicolor light-emitting element of Example 1 of the present invention.

The first and second light-emitting layers having the above-mentioned shapes were disposed in a configuration shown in FIG. 8. FIG. 8 is a schematic sectional view of a multicolor light-emitting element of Example 1. In the figure, reference numeral 35 denotes a cathode, 36a and 36b each denote a light-emitting layer, 37 denotes a second carrier-transporting layer, 38 denotes a first carrier-transporting layer, 39 denotes an anode, and 40 denotes a transparent substrate (generically referred to as "base member"). In this example, an organic EL element array was prepared in which the light-emitting layers overlap not only in an interpixel region but also at a part of each of adjacent pixel regions (regions in which adjacent organic EL elements are respectively disposed). In this example, the inclined surface of one of two adjacent light-emitting layers, when viewed from above in FIG. 8, begins with the inside of a region of provision of a lower electrode on which the one light-emitting layer is disposed and extends to the inside of a region of provision of a lower electrode of the adjacent EL element.

The thus prepared element A was made to emit light at a desired current value and the luminance distribution at that time was measured. The results are shown in FIG. 9.

It can be seen from FIG. 9 that light emission is not observed in a region in which both the first and the second light-emitting layers are formed even when the electrodes are present therein.

Incidentally, the difference in luminance between the first and the second light-emitting layers is attributable to the variance of visibility depending on emission spectrum.

Example 2

A multi-color light-emitting element B was prepared by following substantially the same procedure as in Example 1 with the exception that the order of formation of the green-light-emitting layer and red-light-emitting layer in Example 1 was changed, that is, a mixture layer using CBP as a host and Ir(piq)$_3$ as a guest was used as a first light-emitting layer and a mixture layer using Alq$_3$ as a host and Coumarin 6 as a guest was used as a second light-emitting layer.

Figure 6:
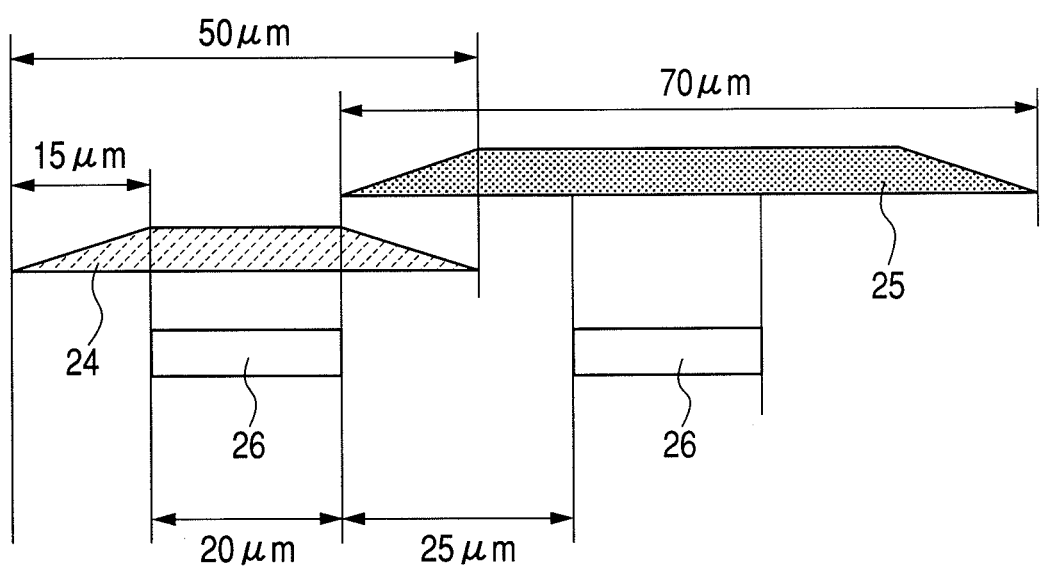
FIG. 6 is a view for explaining a positional relation between a pixel-electrode and a region for forming a light-emitting layer in Example 3.
Figure 7:
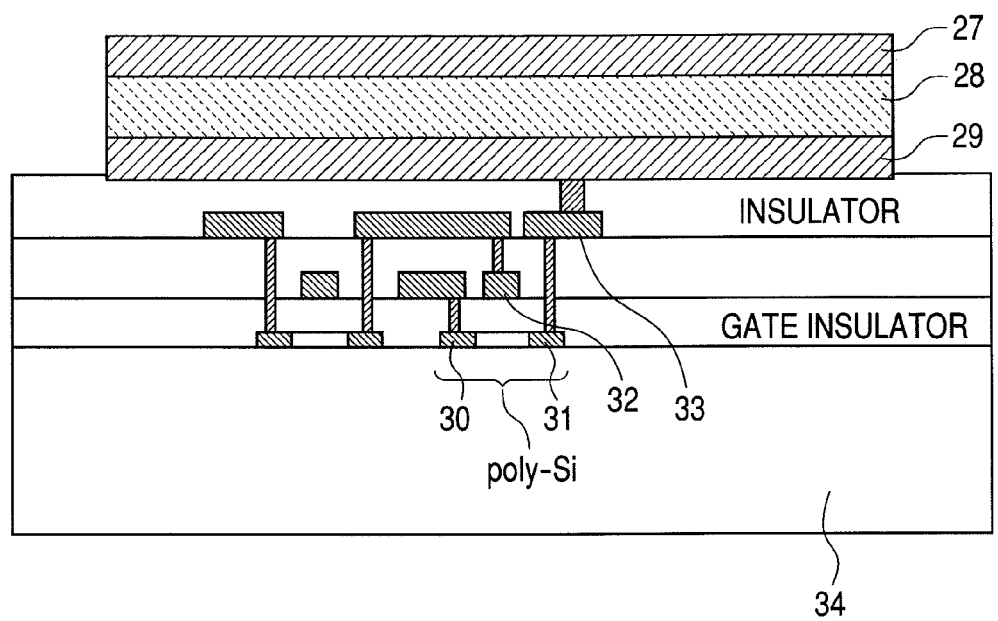
FIG. 7 is a sectional view of an organic EL element having a conventional top emission structure.

FIG. 6 shows the relation between an electrode width, an electrode interval, and film formed regions. FIG. 6 illustrates two electrodes of the same shape and first and second light-emitting layers disposed on the two electrodes respectively. In the figure, reference numeral 24 denotes a first light-emitting layer, 25 denotes a second light-emitting layer and 26 denotes pixel electrodes. That is, as illustrated in the figure, in this example, an electrode pitch was set to 45 μm, an electrode width was set to 20 μm, and an electrode interval was set to 25 μm.

Moreover, masks were adjusted such that the first light-emitting layer had a width of a peripheral region of about 15 μm and a width of whole formed-region of 50 μm and the second light-emitting layer had a width of a peripheral region of 15 μm and a width of whole formed-region of 70 μm.

Incidentally, at this time, the alignment accuracy was estimated as ±10 μm.

As a result, emission of red light was observed in the first-light-emitting-layer formed region (including the peripheral region), while emission of green light was observed only in a region where the first light-emitting layer was not formed.

Example 3

In this example, a multicolor light-emitting element was prepared which had a configuration shown in FIG. 8, that is, a configuration for taking out light on the cathode side (top emission structure).

A Cr film was formed on a glass substrate (Corning 1737 (trade name) manufactured by Corning Inc.) (transparent substrate 40) by sputtering in a thickness of 100 nm and patterned by a lift-off method to form an anode having light reflectivity (reflective electrode 39), thereby forming a substrate with a Cr electrode.

On this Cr substrate, organic compound layers (not illustrated) of the same constitution as described in Example 1 and a transparent electrode (cathode 35) were continuously formed in a vacuum chamber of $10^{-4}$ Pa through vacuum evaporation using resistive heating to obtain a multi-color light-emitting element C.

The thus formed element C did not cause any color mixing though showing a slight change in luminance at a periphery of the pixel electrodes and exhibited excellent color displaying performance.

This application claims priority from Japanese Patent Application No. 2004-030829 filed Feb. 6, 2004, which is hereby incorporated by reference herein.

What is claimed is:

1. A production method of an organic EL element array comprising a first organic EL element and a second organic EL element disposed adjacent to the first organic EL element, each organic EL element comprising a first electrode, a first carrier-transporting layer, a light-emitting layer, a second carrier-transporting layer, and a second electrode, the production method comprising the steps of:

forming a plurality of first electrodes;

forming a first carrier-transporting layer in common to and on the plurality of first electrodes through an interpixel region;

forming a first light-emitting layer of a first organic EL element on the first carrier-transporting layer and in a region in which the first organic EL element is formed a film thickness of the first light-emitting layer being larger on the first electrode than on the interpixel region;

forming a second light-emitting layer of a second organic EL element on the first carrier-transporting layer and in a region in which the second organic EL element is formed a film thickness of the second light-emitting layer being larger on the first electrode than on the interpixel region; and forming a second carrier-transporting layer in common to and on the first light-emitting layer and the second light-emitting layer through the interpixel region wherein the second light-emitting layer covers a portion of the first light-emitting layer in the interpixel region, wherein carrier-transporting property of one of the first light-emitting layer and the second light-emitting layer is electron-transporting property and carrier-transporting property of the other is hole-transporting property, wherein carrier-transporting property of the first light-emitting layer is hole-transporting property when carrier-transporting property of the first carrier-transporting layer is electron-transporting property or is electron-transporting property when carrier-transporting property of the first carrier-transporting layer is hole-transporting property.

2. The production method of an organic EL element array according to claim 1, wherein the second light-emitting layer is formed on and in contact with the first light-emitting layer existing in the interpixel region.

3. The production method of an organic EL element array according to claim 1, wherein the first light-emitting layer and the second light-emitting layer each have a host material and a guest material, wherein one of the host material of the first light-emitting layer and the host material of the second light-emitting layer has electron-transporting property and the other has hole-transporting property, and wherein the host material of the first light-emitting layer has hole-transporting property when the first carrier-transporting layer has electron-transporting property or has electron-transporting property when the first carrier-transporting layer has hole-transporting property.

4. The production method of an organic EL element array according to claim 1, wherein the interpixel region has a configuration such that a first electrode of the first organic EL element, the first carrier transporting layer, the first light-emitting layer, the second light-emitting layer, the second carrier transporting layer, and a second electrode of said first organic EL element are arranged in this order.

5. The production method of an organic EL element array according to claim 1, wherein the first light emitting layer is a light emitting layer for emitting a shorter wavelength light and the second light emitting layer is a light emitting layer for emitting a longer wavelength light.

6. An organic EL element array comprising a first organic EL element and a second organic EL element, each of the organic EL elements comprising a first electrode, a second electrode, a light-emitting layer disposed between the first electrode and the second electrode, a first carrier-transporting layer disposed between the first electrode and the light-emitting layer, and a second carrier transporting layer disposed between the second electrode and the light-emitting layer, wherein the first carrier-transporting layer of the first organic EL element and the first carrier-transporting layer of the second organic EL element are continuous with each other, wherein the second carrier-transporting layer of the first organic EL element and the second carrier-transporting layer of the second organic EL element are continuous with each other, wherein the carrier-transporting property of the light-emitting layer of the first organic EL element is different from the carrier-transporting property of the light-emitting layer of the second organic EL element, wherein the carrier-transporting property of the light-emitting layer of the first organic EL element is different from the carrier-transporting property of the first carrier-transporting layer, and wherein an emission wavelength of the light-emitting layer of the first organic EL element is shorter than an emission wavelength of the light-emitting layer of the second organic EL element, wherein a film thickness of the first light-emitting layer is larger on the first electrode than on the interpixel region, and wherein a film thickness of the second light-emitting layer is larger on the first electrode than on the interpixel region.

7. The organic EL element array according to claim 6, wherein the light-emitting layer of the first organic EL element is in contact with the light-emitting layer of the second organic EL element.

8. The organic EL element array according to claim 6, wherein at least one of the light-emitting layers comprises a host material and a guest material.

9. The organic EL element array according to claim 7, wherein the light-emitting layer of the second organic EL element is disposed on the light-emitting layer of the first organic EL element.

10. An organic EL element array comprising a first organic EL element and a second organic EL element disposed adjacent to the first organic EL element, each organic EL element comprising a first electrode, a first carrier-transporting layer, a light-emitting layer, a second carrier-transporting layer, and a second electrode, the array comprising:

a plurality of first electrodes;

a first carrier-transporting layer in common to and on the plurality of first electrodes through an interpixel region;

a first light-emitting layer of a first organic EL element on the first carrier-transporting layer and in a region in which the first organic EL element is formed, a film thickness of the first light-emitting layer being larger on the first electrode than on the interpixel region;

a second light-emitting layer of a second organic EL element on the first carrier-transporting layer and in a region, a film thickness of the second light-emitting layer being larger on the first electrode than on the interpixel region; and a second carrier-transporting layer in common to and on the first light-emitting layer and the second light-emitting layer through the interpixel region, wherein the second light-emitting layer covers a portion of the first light-emitting layer in the interpixel region, wherein carrier-transporting property of one of the first light-emitting layer and the second light-emitting layer is electron-transporting property and carrier-transporting property of the other is hole-transporting property, and wherein carrier-transporting property of the first light-emitting layer is hole-transporting property when carrier-transporting property of the first carrier-transporting layer is electron-transporting property or is electron-transporting property when carrier-transporting property of the first carrier-transporting layer is hole-transporting property.

* * * * *